US012666882B2

(12) United States Patent
Jeon et al.

(10) Patent No.: US 12,666,882 B2
(45) Date of Patent: Jun. 23, 2026

(54) 3-DIMENSIONAL MEMRISTOR ELEMENT AND METHOD FOR MANUFACTURING THE SAME

(71) Applicant: Korea Advanced Institute of Science and Technology, Daejeon (KR)

(72) Inventors: Seokwoo Jeon, Daejeon (KR); Gwangmin Bae, Daejeon (KR); Gunho Chang, Daejeon (KR)

(73) Assignee: Korea Adanced Institute of Science and Technology, Daejeon (KR)

( * ) Notice: Subject to any disclaimer, the term of this patent is extended or adjusted under 35 U.S.C. 154(b) by 777 days.

(21) Appl. No.: 18/147,076

(22) Filed: Dec. 28, 2022

(65) Prior Publication Data

US 2024/0081161 A1     Mar. 7, 2024

(30) Foreign Application Priority Data

Sep. 2, 2022    (KR) ......................... 10-2022-0111586

(51) Int. Cl.
H10N 70/00 (2023.01)
H10N 70/20 (2023.01)

(52) U.S. Cl.
CPC ......... H10N 70/881 (2023.02); H10N 70/023 (2023.02); H10N 70/24 (2023.02); H10N 70/841 (2023.02)

(58) Field of Classification Search
CPC ..... H10N 70/881; H10N 70/841; H10N 70/24
See application file for complete search history.

(56) References Cited

U.S. PATENT DOCUMENTS

| | | |
|---|---|---|
| 7,397,688 B2 | 7/2008 | Tajiri |
| 2024/0081161 A1* | 3/2024 | Jeon ...................... H10N 70/883 |

FOREIGN PATENT DOCUMENTS

| | | |
|---|---|---|
| JP | 2019-057621 A | 4/2019 |
| KR | 10-2006-0109477 A | 10/2006 |
| KR | 2012-0032909 A | 4/2012 |
| KR | 2019-0003027 A | 1/2019 |

OTHER PUBLICATIONS

Jeon et al., "Fabricating Complex Three-Dimensional Nanostructures with High-Resolution Conformable Phase Masks;" Proceedings of the National Academy of Sciences, vol. 101, No. 34; Aug. 24, 2004; 6 Pages.

(Continued)

*Primary Examiner* — Mark V Prenty
(74) *Attorney, Agent, or Firm* — DALY, CROWLEY, MOFFORD & DURKEE, LLP

(57) ABSTRACT

A 3D memristor element includes a 3D nano-composite including a resistance-varying part, a first conductor and a second conductor, a first terminal electrically connected to the first conductor, and a second terminal electrically connected to the second conductor. The resistance-varying part includes a plurality of nano-shells, which are three-dimensionally arranged and connected to each other. The first conductor is disposed in the nano-shells and has a 3D network structure thereby forming a 3D interface with the nano-shells. The second conductor three-dimensionally surrounds the resistance-varying part, and is separated from the first conductor by the resistance-varying part.

9 Claims, 12 Drawing Sheets

(56) References Cited

OTHER PUBLICATIONS

Jeon et al., "Three-Dimensional Nanofabrication with Rubber Stamps and Conformable Photomasks;" Article from *Advanced Materials,* vol. 16, No. 15; Aug. 4, 2004; 5 Pages.
Shir et al., "Three-Dimensional Nanofabrication with Elastomeric Phase Masks;" Feature Article from Journal of Physical Chemistry B, vol. 111; Received May 27, 2007; pp. 12945-12958; 14 Pages.

* cited by examiner

10

— 140

— 150

— 160

150

LIGHT EXPOSURE

MK

120'

112

111

100

DEVELOPER

130

112

111

100

3-DIMENSIONAL MEMRISTOR ELEMENT AND METHOD FOR MANUFACTURING THE SAME

CROSS-REFERENCE TO RELATED APPLICATION

This application claims priority to and benefits of Korean Patent Application No. 10-2022-0111586 under 35 U.S.C. § 119 filed on Sep. 2, 2022 in the Korean Intellectual Property Office, the entire contents of which are incorporated herein by reference.

BACKGROUND

1. Technical Field

The invention relates to a memristor element. More particularly, the invention relates to a memristor including a resistance-varying layer with a three-dimensionally continuous shell shape, the resistance-varying layer having an interface separating a first conductor and a second conductor from each other, and a method for manufacturing the memristor.

2. Description of the Related Art

Recently, since semiconductor devices have reached the limit of Moore's law, and the conventional Von Neumann architecture has intrinsic inefficiency, interest in an artificial intelligence neuromorphic circuit technology that mimics synapses in a brain is increasing. A memristor element attracts attention for a next-generation semiconductor device that may implement a neuromorphic technology because it is non-volatile, has variable resistance and is analog-driven.

However, a conventional memristor element having a two-dimensional planar shape has a small effective size according to an interfacial area limited by two-dimensional interface between a resistance-varying layer and a conductor. Thus, a working current is small and gradual variance of resistance is limited by a small width of resistance variance. Therefore, performance of a memristor element may be rapidly reduced.

SUMMARY

One object of the invention is to provide a three-dimensional (3D) memristor element that may allow a large width of resistance variance with a small power and may have a large interfacial area for resistance variance between a conductor and a resistance-varying layer so that a reliable working current may be maintained in a memristor element, especially even when an interface-control memristor element is scale-downed.

Another object of the invention is to provide a method of manufacturing the 3D memristor element.

According to an embodiment of the invention, a 3D memristor element includes a 3D nano-composite including a resistance-varying part, a first conductor and a second conductor, a first terminal electrically connected to the first conductor, and a second terminal electrically connected to the second conductor. The resistance-varying part includes a plurality of nano-shells, which are three-dimensionally arranged and connected to each other. The first conductor is disposed in the nano-shells and has a 3D network structure thereby forming a 3D interface with the nano-shells. The second conductor three-dimensionally surrounds the resistance-varying part, and is separated from the first conductor by the resistance-varying part.

In an embodiment, the resistance-varying part includes at least one of a metal, a metal oxide, a metal nitride and a polymer.

In an embodiment, the resistance-varying part includes at least one of $InO_2$, $SnO_2$, $SrTiO_3$, $SiO_x$, $CeO_2$, $Al_2O_3$, $TiO_2$, ZnO, $HfO_2$, $HfAlO_x$, $HfSiO_x$, $TaO_x$, PCMO ($Pr_{0.3}Ca_{0.7}MnO_3$), $SiN_x$, $TiN_x$, $TaN_x$, amorphous silicon, Ag and pV3D3(poly(1,3,5-trimethyl-1,3,5-trivinyl cyclotrisiloxane).

In an embodiment, the 3D memristor element further includes a dummy layer including a same material as the resistance-varying part and disposed on the first terminal. The second terminal is disposed on the dummy layer, and the first terminal is disposed under the 3D nano-composite.

In an embodiment, the second terminal includes a same material as the second conductor.

In an embodiment, a shell thickness of the resistance-varying part is 1 nm to 100 nm.

In an embodiment, the resistance-varying part includes a resistance-varying layer contacting the first conductor, and an oxygen-storing layer contacting the second conductor and including a material different from the resistance-varying layer to have a composition including an oxygen vacancy.

In an embodiment, the resistance-varying layer includes a ferroelectric material, and the oxygen-storing layer includes at least one of $BiFeO_3$, $HfO_x$, $Sb_2Te_3$ and $TaO_{2-x}$.

In an embodiment, the first conductor includes a filling portion including a metal and spaced apart from the resistance-varying part, and a contact layer including a metal oxide or a metal nitride and contacting the resistance-varying part.

According to an embodiment of the invention, a method for manufacturing a 3D memristor element is provided. According to the method, a 3D porous template is formed on a substrate including a lower conductive layer. The 3D porous template is filled with a first conductive material through an electroplating process. The 3D porous template is removed to form a first conductor having a 3D porous structure with an inverse shape of the 3D porous template and including the first conductive material. A resistance-varying part having a nano-shell shape is formed in pores of the first conductor. A second conductive material is provided in the pores to form a second conductor.

According to embodiments of the invention, a memristor element has a 3D nano-composite structure. The memristor element may increase an interfacial area per unit volume by adjusting a size and a shape of a unit cell. Thus, a working current may be maintained when a size of a memristor is scale-downed, and characteristics for resistance variance may be precisely adjusted. Furthermore, gradual resistance variance applicable for an analog device may be achieved with small power.

DETAILED DESCRIPTION OF THE EMBODIMENTS

Figure 1:
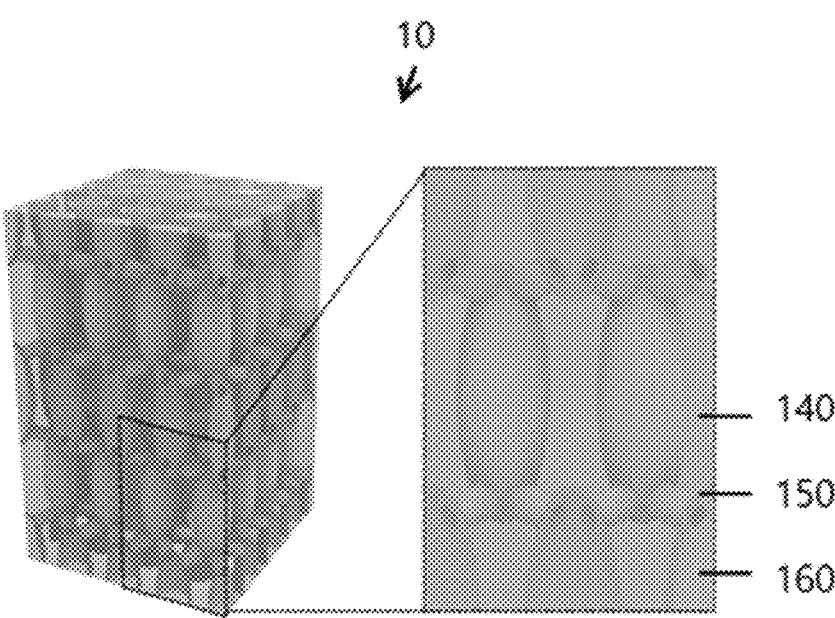
FIG. 1 is a schematic view illustrating a memristor element according to an embodiment.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
FIG. 2 is a schematic view illustrating a resistance-varying part of a memristor element according to an embodiment.
Figure 2:
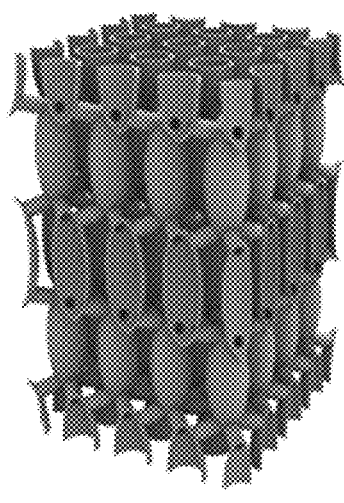
Figure 3:
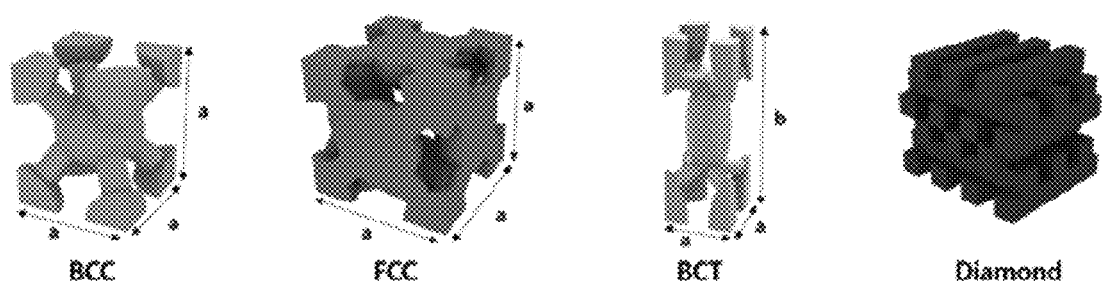
FIG. 3 is a schematic view illustrating a structure of a memristor element according to embodiments.

FIG. 1 is a schematic view illustrating a memristor element according to an embodiment. FIG. 2 is a schematic view illustrating a resistance-varying part of a memristor element according to an embodiment. FIG. 3 is a schematic view illustrating a structure of a memristor element according to embodiments.

Referring to FIGS. 1 and 2, a 3D memristor element 10 according to an embodiment has a 3D metallic nano-composite structure. For example, the 3D memristor element 10 includes a resistance-varying part 150 having a 3D nano-shell structure, a first conductor 140 surrounded by the resistance-varying part 150 and a second conductor 160 surrounding the resistance-varying part 150.

In an embodiment, the resistance-varying part 150 may include a plurality of nano-shells that are three-dimensionally arranged and connected to each other. The first conductor 140 may be disposed in the nano-shells, and may have a 3D network structure in which portions disposed in the nano-shells are three-dimensionally connected to each other. The second conductor 160 may have a 3D structure surrounding the resistance-varying part 150. Thus, the first conductor 140 and the second conductor 160 may be entirely separated from each other by the resistance-varying part 150. The resistance-varying part 150 may include or be referred to as a resistance-varying layer.

For example, the first conductor 140 and the second conductor 160 may each include a metal, a conductive metal oxide or the like. For example, the first conductor 140 and the second conductor 160 may each include Pt, Ni, Au, Ag, Cu, Co, Fe, Pd, Ru, TiN or a combination thereof. The first conductor 140 and the second conductor 160 may include a same material or different materials.

In an embodiment, the resistance-varying part 150 may include a non-conductor (an insulating material). However, embodiments are not limited thereto. For example, the resistance-varying part 150 may include a metal, a metal oxide, a metal nitride, a polymer or a combination thereof. For example, the resistance-varying part 150 may include a metal oxide such as $InO_2$, $SnO_2$, $SrTiO_3$, $SiO_x$, $CeO_2$, $Al_2O_3$, $TiO_2$, ZnO, $HfO_2$, $HfAlO_x$, $HfSiO_x$, $TaO_x$, PCMO ($Pr_{0.3}Ca_{0.7}MnO_3$) or the like, a metal nitride such as $SiN_x$, $TiN_x$, $TaN_x$ or the like, amorphous silicon, a metal such as Ag or the like, or a polymer such as pV3D3(poly(1,3,5-trimethyl-1,3,5-trivinyl cyclotrisiloxane) or the like. However, embodiments are not limited thereto, and various materials known to be applicable for a resistance-varying part of a memristor element may be used.

In an embodiment, the resistance-varying part 150 may have a multi-layered structure. For example, the resistance-varying part 150 may include a resistance-varying layer and an oxygen-storing layer. The oxygen-storing layer may include a material different from the resistance-varying layer, and may have a composition having an oxygen vacancy. The oxygen-storing layer may increase diffusion of oxygen vacancies or ions in an interface-control memristor thereby increasing a range of resistance variance or a speed of resistance variance.

In an embodiment, the resistance-varying layer may include a ferroelectric material such as $CeO_2$, $HfSiO_x$, $TaO_x$ or the like.

The oxygen-storing layer may have a composition in which a concentration of oxygen vacancies or ions is increased. For example, the oxygen-storing layer may include $BiFeO_3$, $HfO_x$, $TiO_{2-x}$, $Sb_2Te_3$, $TaO_2$, or a combination thereof (0<x<2). However, embodiments are not limited thereto. For example, the oxygen-storing layer may include $Al_2O_3$, $SiO_2$ or a combination thereof.

The 3D nano-composite structure may constitute a memristor element of a filament type or an interface type. For example, when different voltages are applied to the first conductor 140 and the second conductor 160, a conductive filament may be formed in the resistance-varying part 150 by the voltage difference. A range of resistance variance may be changed depending on the voltage difference. Thus, the 3D nano-composite structure may operate as a memristor element. In another embodiment, a resistance of the resistance-varying part 150 may be varied by oxidation/reduction reaction at an interface between the resistance-varying part and the conductor. For example, when an electric field is formed at the interface by the voltage difference, exchange of oxygen vacancies or ions appear thereby varying a thickness of an interfacial layer. The thickness variance of the interfacial layer changes a Shottky energy barrier and a length of a depletion region thereby changing a resistance of the resistance-varying part 150.

The 3D nano-composite structure may have various 3D structures depending on a manufacturing method thereof. For example, the 3D nano-composite structure may have a crystal grain structure that is artificially formed. For example, the 3D nano-composite structure may have various structures such as 14 types of Bravais lattice structure including a body-centered cubic (BCC) structure, a face-centered cubic (FCC) structure and a body-centered tetragonal (BCT) structure, which are illustrated in FIG. 3, a diamond structure, a zyroid structure, an unordered structure or the like. However, embodiments are not limited thereto, and the 3D nano-composite structure may have any 3D continuous structure that may increase an interfacial area. For example, a period of the nano-shell may be 10 nm to 1 μm, and a shell thickness of the resistance-varying part 150 may be 1 nm to 100 nm. In an embodiment, a shell thickness of the resistance-varying part 150 may be 1 nm to 60 nm. When a shell thickness of the resistance-varying part 150 is excessively small, a problem such as leakage may appear. When a shell thickness of the resistance-varying part 150 is excessively large, an operation voltage may be increased, and a switching speed may be reduced. However, embodiments are not limited thereto, and the resistance-varying part 150 may have various dimensions and shapes depending on desired characteristics and manufacturing processes for a memristor.

A 3D memristor element according to an embodiment may increase an interfacial area per unit volume by adjusting a size and a shape of a unit cell. Thus, a working current may be maintained when a size of a memristor is scale-downed, and characteristics for resistance variance may be precisely adjusted. Furthermore, gradual resistance variance applicable for an analog device may be achieved with small power.

FIGS. 4A, 4B, 4C, 4D, 4E, 4F and 4G are cross-sectional views illustrating a method for manufacturing a 3D memristor element according to an embodiment. FIGS. 5A, 5B, 5C and 5D are enlarged cross-sectional views illustrating a process of forming a 3D structure in a method for manufacturing a 3D memristor element according to an embodiment. FIGS. 6A and 6B are cross-sectional views illustrating a method for manufacturing a 3D memristor element according to an embodiment.

Figure 4A:
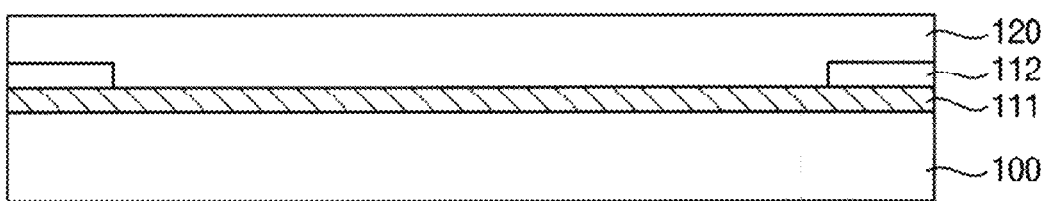
FIGS. 4A, 4B, 4C, 4D, 4E, 4F and 4G are cross-sectional views illustrating a method for manufacturing a 3D memristor element according to an embodiment.

Referring to FIG. 4A, an adhesive film 112 and a photoresist film 120 are formed on a substrate. In an embodiment, the substrate may include a lower conductive layer 111 disposed on a base substrate 100. The adhesive film 112 is formed on the lower conductive layer 111. For example, the adhesive film 112 may include an opening. The photoresist film 120 is formed on the adhesive film 112 and the lower conductive layer 111.

In an embodiment, the base substrate 100 may include a non-conductive material such as glass, silicon, quartz or the like. The lower conductive layer 111 may include a metal. However, embodiments are not limited thereto, and the substrate may be entirely conductive.

The lower conductive layer 111 may be used as an electrode in a plating process for forming a 3D nano-structure conductor and as an electrode that applies a voltage to a 3D memristor element. For example, the lower conductive layer 111 may include Pt, Ni, Cu, Co, Fe, Pd, Ru, Ti, Mo, Al, Cr, Au or a combination thereof.

The adhesive film 112 may be formed of a photoresist material. For example, a first photoresist material may be coated on the substrate through a spin coating process. The first photoresist material coated on the substrate may be preliminarily heated (soft-baked), for example, at about 90° C. to about 100° C. While a portion of the coated layer, which corresponds to the opening, or a remaining portion thereof may be masked, a light is irradiated onto the coated layer. Thereafter, the coated layer is developed to remove the light-exposed portion or the non-light-exposed portion thereby forming the opening. Thereafter, the coated layer with the opening may be hard-baked on a hot plate at about 100° C. to about 250° C. thereby forming the adhesive film 112.

The photoresist film 120 may fill in the opening thereby contacting the lower conductive layer 111 of the substrate.

For example, a second photoresist material may be coated on the adhesive film 112 and an exposed upper surface of the lower conductive layer 111 through a spin coating process. The second photoresist material coated on the substrate 100 may be soft-baked, for example, at about 90° C. to about 100° C. to form the photoresist film 120.

The first photoresist material and the second photoresist material for forming the adhesive film 112 and the photoresist film 120 may include a same composition or different compositions from each other. In some embodiment, the first photoresist material or the second photoresist material may include an epoxy-based negative-tone photoresist composition, or a DNQ-based positive-tone photoresist composition. In some embodiments, the first photoresist material or the second photoresist material may include an organic-inorganic hybrid material, hydrogel, a phenolic resin or the like, which can be cross-linked by light exposure.

In an embodiment, the adhesive film 112 may have a thickness of about 0.5 μm to about 5 μm. The photoresist film 120 may have a thickness of about 0.3 μm to about 1 mm.

Figure 4B:
Figure 4B:
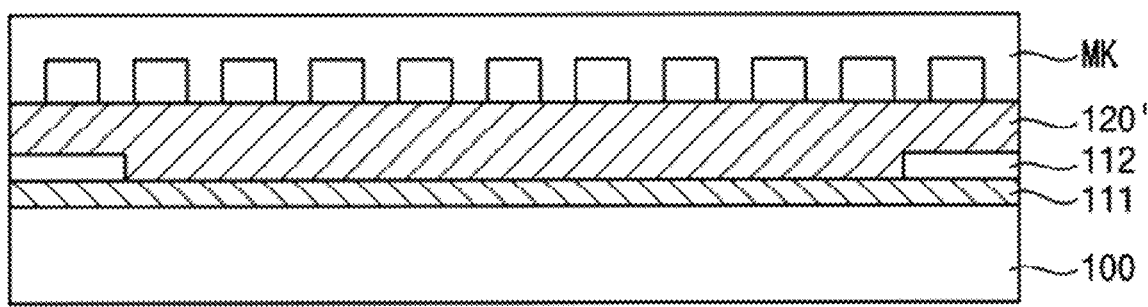
Figure 4C:
Figure 4C:
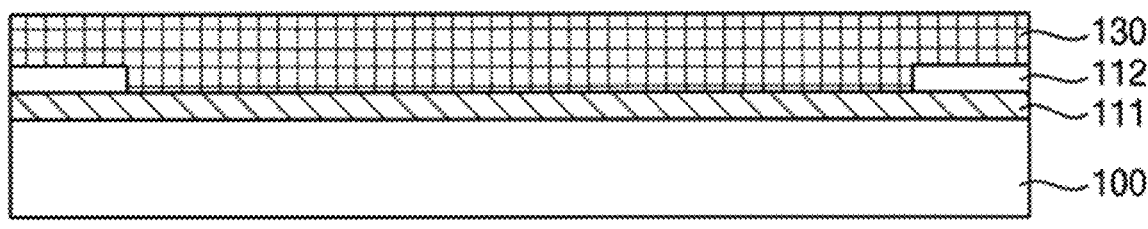

Referring to FIGS. 4B and 4C, the photoresist film 120 is exposed to a light and then developed to form a 3D porous template 130.

In an embodiment, a three-dimensionally distributed light is provided to the photoresist film 120. The three-dimensional light-exposure may be performed by proximity-field nano-patterning (PnP) method.

In PnP method, a light is irradiated onto a phase mask MK including an elastomer material and a periodic uneven pattern. A light passing through the phase mask MK is periodically three-dimensionally distributed by interference effect. Thus, the photoresist layer may be three-dimensionally exposed to a light. For example, the phase mask MK may have a convexo-concave lattice structure formed at a surface, through which a light passes, and may include a flexible elastomer material. When the phase mask MK contacts the photoresist layer, the phase mask MK may spontaneously adhere to or conformal-contact a surface of the photoresist film by Van der Waals force.

For example, when a laser having a wavelength similar to a periodicity of the lattice-of the phase mask MK is irradiated onto the phase mask MK, a three-dimensionally distributed light may be formed by Talbot effect. When the photoresist film is formed of a negative-tone photoresist composition, cross-linking of a resin may be selectively caused in a portion where light intensity is relatively high by constructive interference, and may be hardly caused in a remaining portion where light intensity is relative low. Thus, the remaining portion, which is barely or not light-exposed, may be removed in a developing process. In addition, a drying process may be further performed. As a result, a porous polymeric structure having a 3D porous network with a period of hundreds of nanometers to several micrometers.

In an embodiment, a pore size and a period of the porous polymeric structure may be adjusted depending on a wavelength of the laser and a design of the phase mask MK.

More detailed explanation of the PnP method are disclosed in J. Phys. Chem. B 2007, 111, 12945-12958; Proc. Natl. Acad. Sci. U.S.A. 2004, 101, 12428; Adv. Mater. 2004, 16, 1369; and Korean Patent Publication 2006-0109477, which are incorporated herein for references.

In an embodiment, the phase mask MK used in the PnP process may include a material such as PDMS (polydimetyl siloxane), PUA (polyurethane acrylate), PFPE (perfluoropolyether) or the like.

As explained in the above, when the photoresist film 120 is formed from a negative-tone photoresist composition, a light-exposed portion of the photoresist film 120 may remain while a non-light-exposed portion thereof may be removed. Thus, the 3D porous template 130 including 3D nano-pores may be formed on the substrate 100. Examples of a developing solution (developer) may include, for example, PGME (propylene glycol monomethyl ether acetate).

For example, the 3D porous template 130 may include channels formed by nano-scaled pores in a range of about 1 nm to about 2,000 nm, which are three-dimensionally connected to each other entirely or partially. Thus, the 3D porous template 130 may have a 3D network structure periodically distributed by the channels.

Figure 4D:
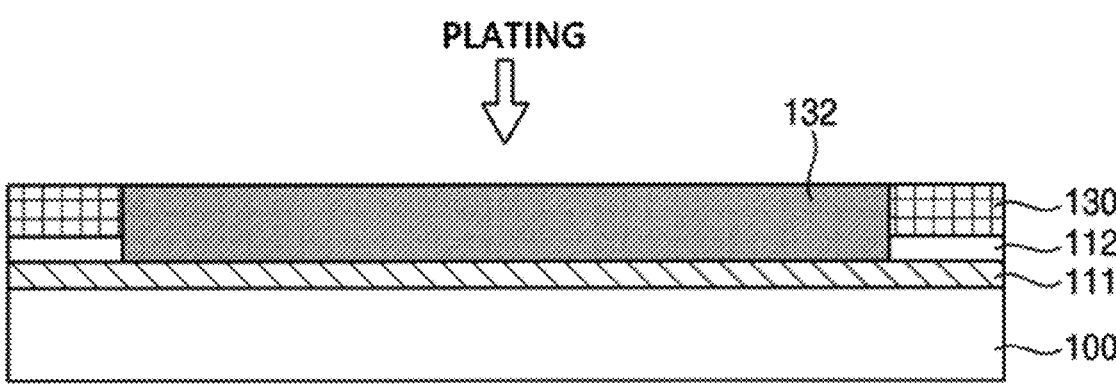

Referring to FIG. 4D, a conductive material is filled in the pores (channels) of the 3D porous template 130 to form a composite 132.

For example, the conductive material may be provided by a plating method such as an electroplating method, an electro-less plating method or the like. In an embodiment, the conductive material may be provided by an electroplating method. However, embodiments are not limited thereto. For example, the conductive material may be provided by various methods including a liquid process, a vapor deposition method or the like, which are known to be capable of filling pores.

In order to perform an electroplating method, an electrolytic cell including an anode, an electrolyte and a cathode may be used. The lower conductive layer 111 under the 3D porous template 130 may be used as the cathode. The electrolyte may include cations of a conductive material such as a metal. Metal cations in the electrolyte may move into the 3D porous template 130 when predetermined voltages are applied to the electrodes.

In an embodiment, an electroplated area may be defined by the adhesive film 112. For example, an area covered by the adhesive film 112 may not be substantially electroplated, and an area overlapping the opening of the adhesive film 112 may be electroplated.

The electrolyte may have various compositions depending on a material to be electroplated. For example, the electrolyte may include $H_2PtCl_6$, $CuSO_4$, $CuCl_2$, $NiCl_2$, $CoSO_4$, $PdCl_2$, $RuCl_3$, $KAu(CN)_2$ or a combination thereof.

In an embodiment, a surface of the 3D porous template 130 may be plasma-treated before the electroplating process. As a result, the surface of the 3D porous template 130 may be changed to be hydrophilic so that the metal cations may easily enter the 3D porous template 130.

A filling ratio of the conductive material in the 3D porous template 130 may be adjusted by controlling a voltage, a current, a process time or the like in the electroplating process.

Figure 4E:
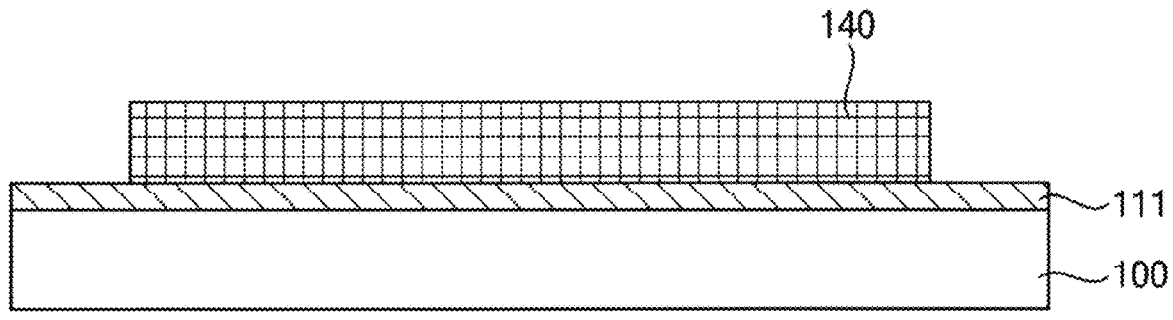
Figure 5A:
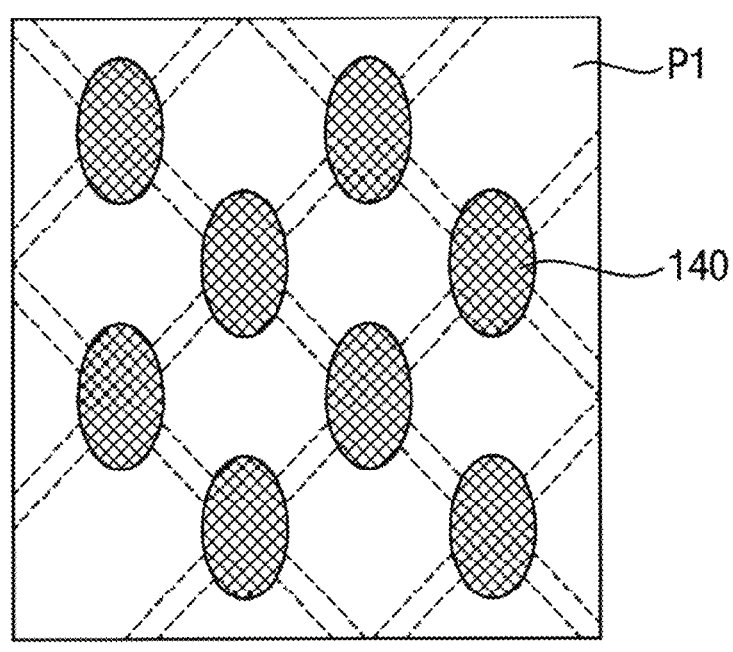
FIGS. 5A, 5B, 5C and 5D are enlarged cross-sectional views illustrating a process of forming a 3D structure in a method for manufacturing a 3D memristor element according to an embodiment.
Figure 6A:
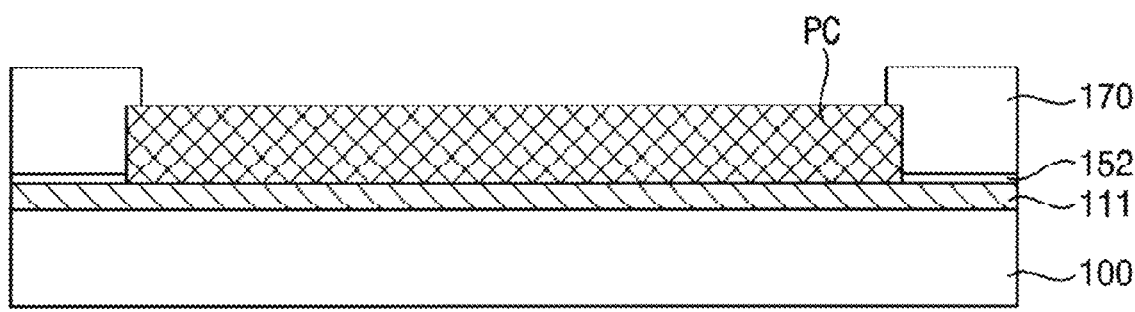
FIGS. 6A and 6B are cross-sectional views illustrating a method for manufacturing a 3D memristor element according to an embodiment.
Figure 6B:
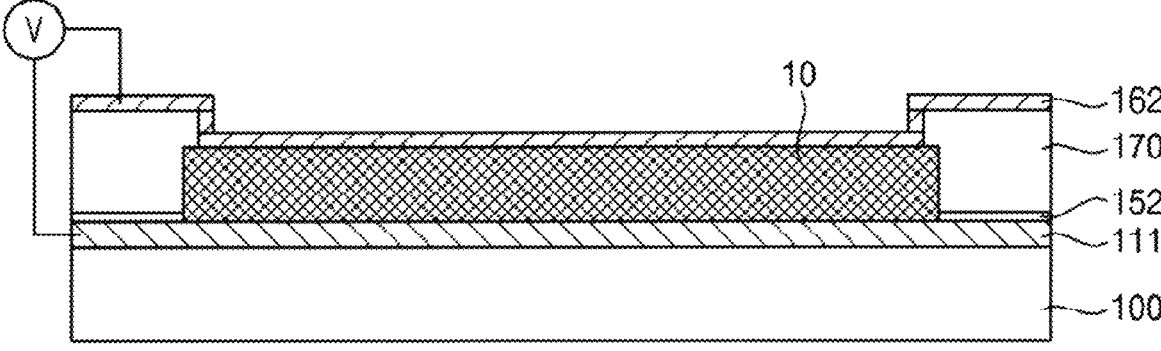

Referring to FIGS. 4E and 5A, the 3D porous template is removed to form a first conductor 140 having a 3D porous structure. For example, the first conductor 140 may include Pt, Ni, Au, Ag, Cu, Co, Fe, Pd, Ru or a combination thereof.

In some embodiment, the 3D porous template may be removed by heat treatment, wet-etching, plasma treatment or the like. When the 3D porous template is removed, the adhesive film may be removed as well.

The plasma treatment may include oxygen-plasma treatment or reactive ion etching (RIE).

The first conductor 140 may have an inverse shape of the 3D porous template. Thus, the first conductor 140 may have a porous structure including pores P1 (channels), which are three-dimensionally connected to each other. Thus, the first conductor 140 may have an ordered 3D network structure including a conductive material.

Figure 4F:
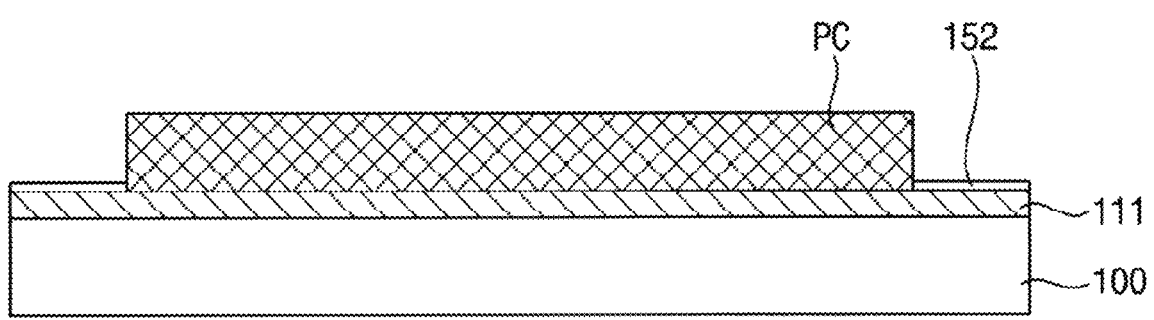
Figure 5B:
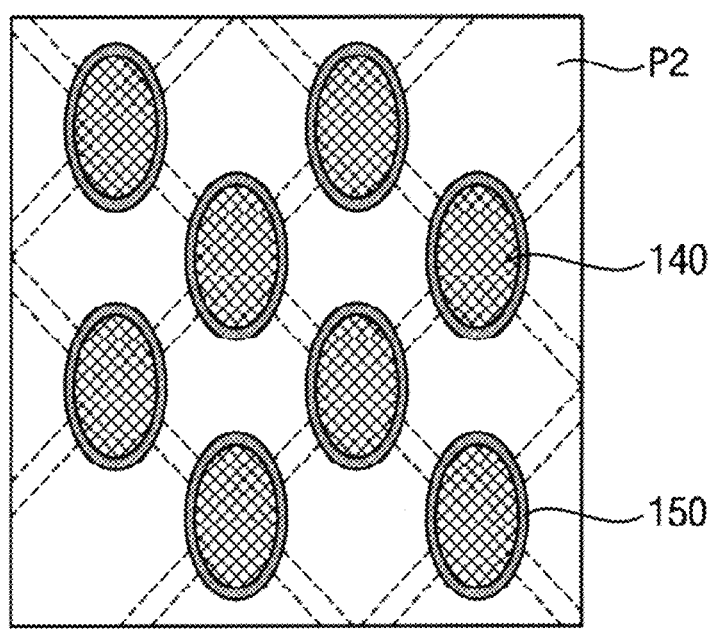

Referring to FIGS. 4F and 5B, a resistance-varying part 150 is formed to have a 3D nano-shell structure surrounding the first conductor 140.

For example, the resistance-varying part 150 may include a metal, a metal oxide, a metal nitride, a polymer or a combination thereof, and may be formed by a proper method depending on a material thereof. In an embodiment, the resistance-varying part 150 may include a ferroelectric material such as hafnium silicon oxide or the like, and may be formed through a vapor deposition process such as atomic layer deposition (ALD).

As a result, a composite PC including the first conductor 140 having a 3D network shape and the resistance-varying part 150 surrounding the first conductor 140 may be obtained. Since the resistance-varying part 150 has a nano-shell structure, the composite PC may have pores P2.

When the resistance-varying part 150 is formed, a dummy layer 152 including a same material as the resistance-varying part 150 may be formed on the lower conductive layer 111 in an area where the first conductor 140 is not disposed. The dummy layer 152 may function as an insulation layer that electrically insulates terminals of a memristor element from each other.

Figure 4G:
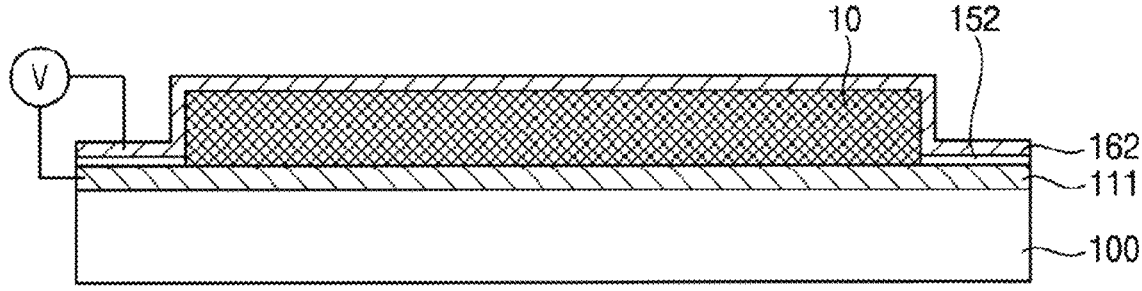
Figure 5C:
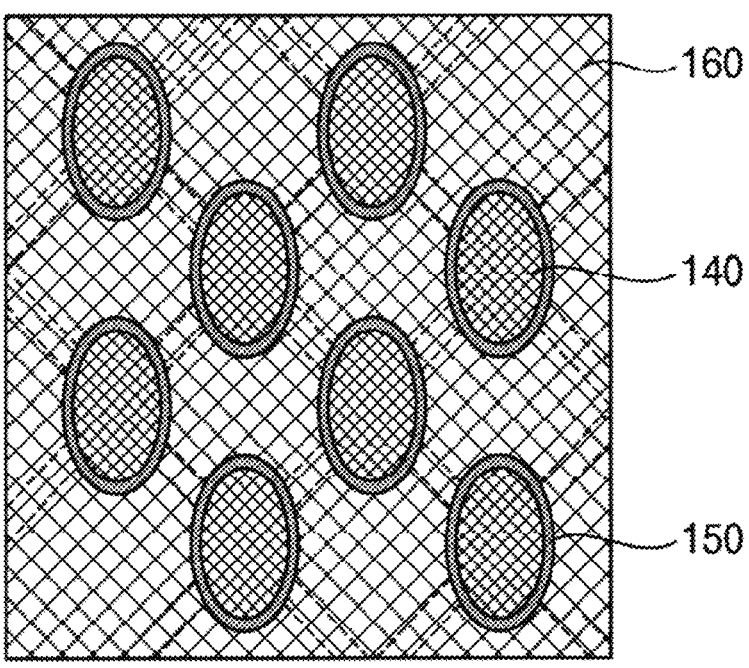

Referring to FIGS. 4G and 5C, a conductive material is filled in the pores of the composite to form a second conductor 160. The second conductor 160 may have a 3D network structure surrounding the resistance-varying part 150. Thus, a 3D memristor element 10 including the first conductor 140, the resistance-varying part 150 and the second conductor 160 may be obtained.

The second conductor 160 may be formed by various methods such as an electroplating method, an electro-less plating method, a vapor deposition method or the like.

When the second conductor 160 is formed, an upper conductive layer 162 may be formed on the dummy layer 152 or on the 3D structure. The upper conductive layer 162 and the lower conductive layer 111 may be insulated from each other by the dummy layer 152, and may be electrically connected to the second conductor 160 and the first conductor 140, respectively. Thus, the upper conductive layer 162 and the lower conductive layer 111 may be used as a first terminal (or a connection electrode) and a second terminal to apply a voltage difference to the 3D memristor element 10.

Figure 5D:
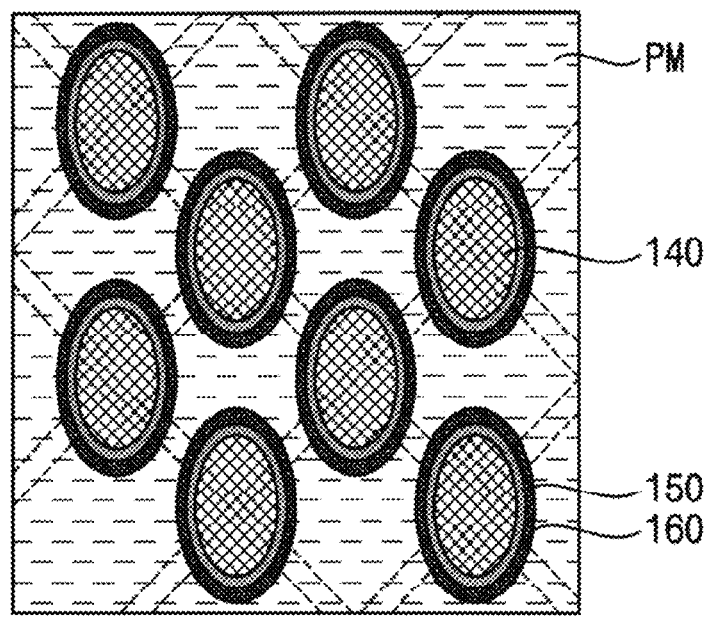

Even though FIG. 5C illustrates that the second conductor 160 entirely fills a space where the first conductor 140 and the resistance-varying part 150 are not formed, embodiments are not limited thereto. For example, the second conductor 160 may be formed to have a thin film (nano-shell) shape surrounding the resistance-varying part 150 as illustrated in FIG. 5D, depending on a forming method thereof. For example, the second conductor 150 having a thin film shape may be formed by a liquid process such as an electro-less plating method, or a vapor deposition method such as CVD, ALD or the like.

When the second conductor 160 has a thin film shape, a protective matrix PM may be further formed to fill pores (space) surrounding the second conductor 160. For example, the protective matrix PM may be formed by filling and curing a polymeric resin such as a phenolic resin, an epoxy resin, a silicone resin, an acrylic resin, a polyimide resin or the like, in the pores. However, embodiments are not limited thereto. For example, the protective matrix PM may include an inorganic material such as silicon oxide, silicon nitride or the like, and may be firmed by or a vapor deposition method such as CVD, ALD or the like.

In another embodiment, as illustrated in FIGS. 6A and 6B, after an organic insulation layer 170 having an opening that exposes the composite PC is formed, the second conductor may be formed so that an upper conductive layer (upper terminal) 162 may be formed on the organic insulation layer 170 or on the 3D nano-structure.

In the above embodiment, the first conductor 140 is formed prior to and surrounded by the resistance-varying part 150. However, embodiments are not limited thereto. For example, it can be understood that the first conductor may be formed after the second conductor is formed.

Figure 7A:
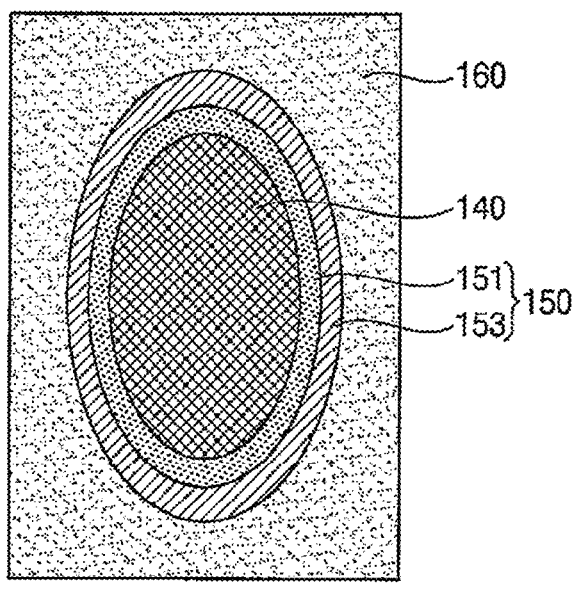
FIGS. 7A and 7B are cross-sectional views illustrating a unit cell of a 3D memristor element according to embodiment.
Figure 7B:
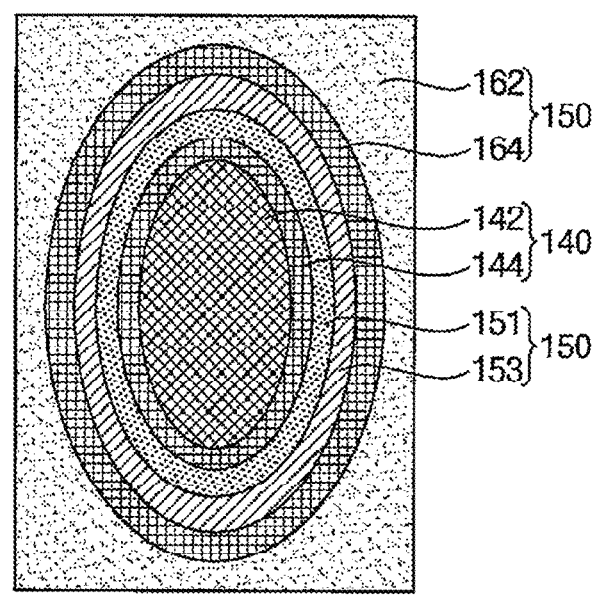

FIGS. 7A and 7B are cross-sectional views illustrating a unit cell of a 3D memristor element according to embodiment.

Referring to FIG. 7A, a 3D memristor element includes a first conductor 140, a resistance-varying part 150 and a second conductor 160. In a unit cell, the resistance-varying part 150 may have a shell shape three-dimensionally surrounding the first conductor 140, and the second conductor 160 may surround the resistance-varying part 150.

In the 3D memristor element, the first conductor 140, the resistance-varying part 150 and the second conductor 160 may each have a periodically ordered structure formed by unit cells that are three-dimensionally connected to each other.

The resistance-varying part 150 may include a resistance-varying layer 151 and an oxygen-storing layer 153. Materials for the resistance-varying layer 151 and the oxygen-storing layer 153 may be substantially same as those that are explained in the above.

In an embodiment, the resistance-varying layer 151 may be formed prior to the oxygen-storing layer 153. If the resistance-varying layer 151 is formed later than the oxygen-storing layer, it may be difficult to control a composition of the resistance-varying layer 151. For example, in a unit cell, the resistance-varying layer 151 may contact the first conductor 140, and may have a shape surrounding the first conductor 140.

Referring to FIG. 7B, a 3D memristor element includes a first conductor 140, a resistance-varying part 150 and a second conductor 160.

The first conductor 140 may include a first filling portion 141 and a first contact layer 143. The resistance-varying part 150 may include a resistance-varying layer 151 and an oxygen-storing layer 153.

A material of the first conductor 140 may be limited by a process for forming the first conductor 140. For example, when the first conductor 140 is formed by an electroplating method, the first conductor 140 may include nickel, silver or the like, which is proper for the electroplating method. If the first conductor 140 including a metal (transition metal) contacts the resistance-varying layer 151, a filament may be formed in the resistance-varying layer 151. Thus, an interface-control memristor element may be hardly formed.

In an embodiment, after the first filling portion 141 of the first conductor 140 is formed, the first contact layer 143 is formed to surround the first filling portion 141. The first contact layer 143 may be formed by a chemical vaporization deposition (CVD) method such as ALD. Thus, the first contact layer 143 including a conductive oxide or a conductive nitride may be formed to contact the resistance-varying part 150. In an embodiment, the first contact layer 143 may include TiN. However, embodiments are not limited thereto. For example, the first contact layer 143 may include a conductive oxide such as InO, ZnO or the like.

After the first contact layer 143 is formed, the resistance-varying layer 151 and the oxygen-storing layer 153 may be sequentially formed.

In an embodiment, the second conductor 140 may include a second filling portion 161 and a second contact layer 163. For example, after oxygen-storing layer 153 is formed, the second contact layer 163 may be formed by CVD to include a conductive nitride or a conductive oxide. Thereafter, the second filling portion 162 may be formed by a liquid process such as a plating method.

FIGS. 8A, 8B, 8C, 8D and 8E are cross-sectional views illustrating a method for manufacturing a 3D memristor element according to an embodiment.

Figure 8A:
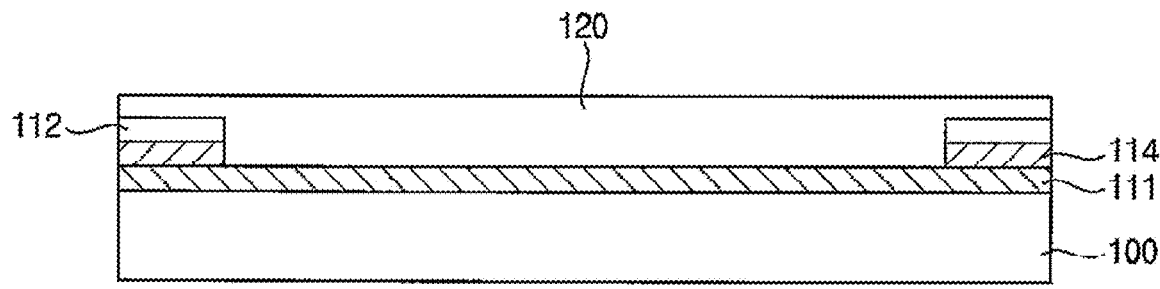
FIGS. 8A, 8B, 8C, 8D and 8E are cross-sectional view illustrating a method for manufacturing a 3D memristor element according to an embodiment.

Referring to FIG. 8A, a sacrificial layer 114, an adhesive film 112 and a photoresist film 120 are formed on a substrate having a lower conductive layer 111. In an embodiment, the sacrificial layer 114 may include a metal. Particularly, the sacrificial layer 114 may include a metal different from the lower conductive layer 111. For example, the lower conductive layer 111 may include chromium or gold, and the sacrificial layer 114 may include titanium. However, embodiments are not limited thereto. For example, the sacrificial layer 114 may include a metal oxide.

The adhesive film 112 is disposed on the sacrificial layer 114. In an embodiment, the adhesive film 112 may be formed to cover a side surface of the sacrificial layer 114.

Thereafter, the photoresist film 120 is exposed to a light, and then developed to form a 3D porous template.

Figure 8B:
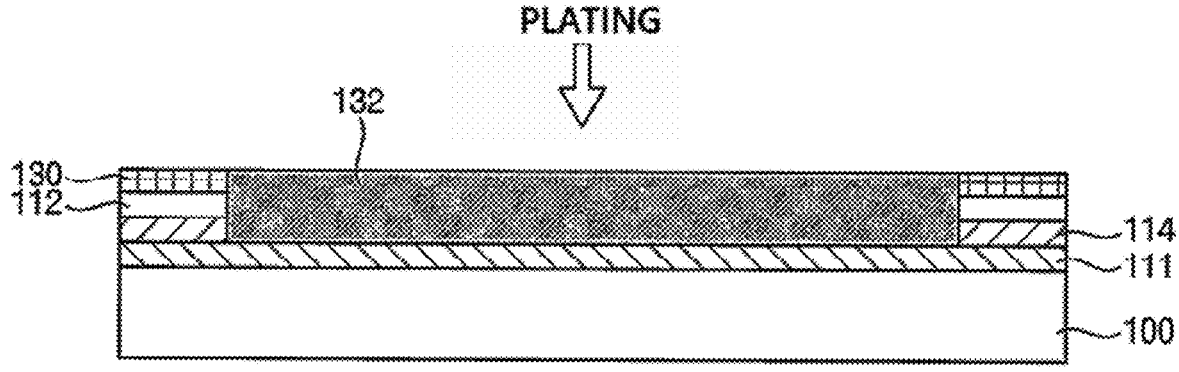

Referring to FIG. 8B, a conductive material is filled in pores of the 3D porous template 130 to form a composite 132.

For example, the conductive material may be provided by a plating method such as an electroplating method, an electro-less plating method or the like. In an embodiment, the conductive material may be provided by an electroplating method. However, embodiments are not limited thereto, and the conductive material may be provided by various methods including a liquid process, a vapor deposition method or the like, which are known to be capable of filling pores.

In an embodiment, an electro-plated area may be defined by the adhesive film 112. For example, an area covered by the adhesive film 112 may not be substantially electroplated, and an area overlapping the opening of the adhesive film 112 may be electroplated.

Figure 8C:
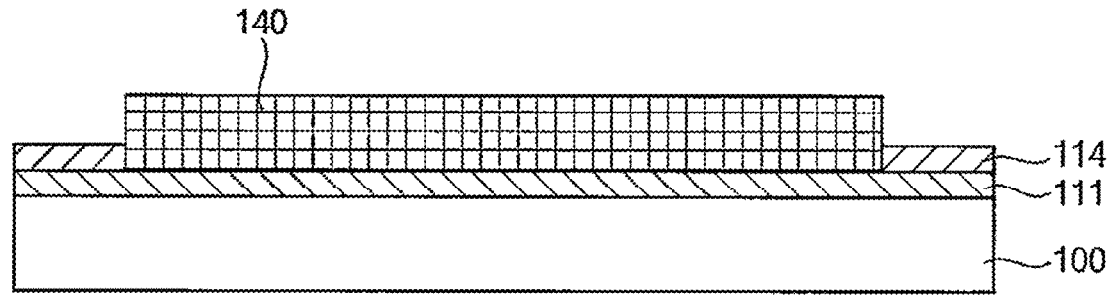

Referring to FIG. 8C, the 3D porous template is removed to form a first conductor 140 having a 3D porous structure. When the 3D porous template is removed, the adhesive film 112 may be removed as well. The sacrificial layer 114 may remain on the lower conductive layer 111. In an embodiment, the sacrificial layer 114 may contact the first conductor 140. However, embodiments are not limited thereto, and the sacrificial layer 114 may be spaced apart from the first conductor 140.

Figure 8D:
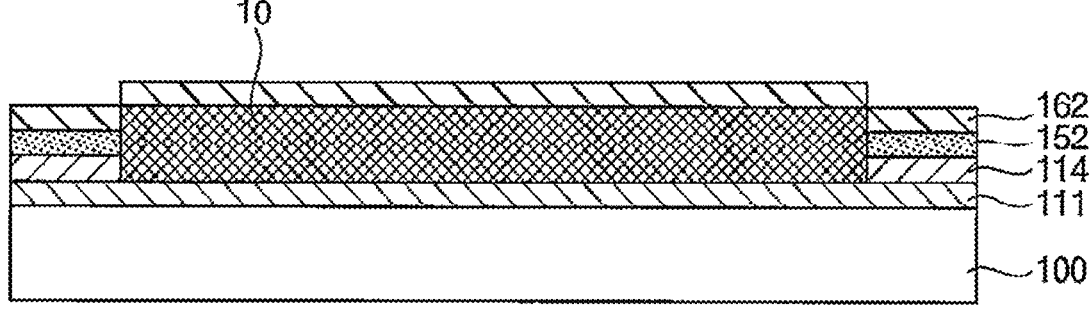

Referring to FIG. 8D, a resistance-varying part is formed to have a 3D nano-shell structure surrounding the first conductor 140. Thereafter, a conductive material is filled in a rest portion of the pores, in which the resistance-varying part is not formed, to form a second conductor. As a result, a 3D memristor element 10 including the first conductor having a 3D network shape, the resistance-varying part having a 3D nano-shell array shape surrounding the first conductor, and the second conductor surrounding the resistance-varying part may be obtained. However, embodiments are not limited thereto. For example, the second conductor may be formed as a thin layer by ALD or the like to have a shell shape surrounding the resistance-varying part, as illustrated in FIG. 5D.

When the resistance-varying part is formed, a dummy layer 152 including a same material as the resistance-varying part may be formed on the sacrificial layer 114. In addition, when the second conductor is formed, an upper conductive layer 162 may be formed on the 3D memristor element 10 and the sacrificial layer 114.

Figure 8E:
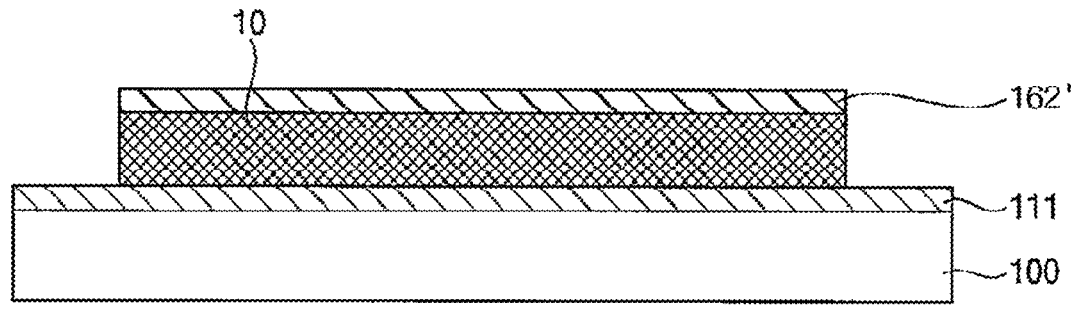

Referring to FIG. 8E, the sacrificial layer 114 is removed so that the dummy layer 152 and a portion of the upper conductive layer 162, which are disposed on the sacrificial layer 114, may be removed (lift-off). In an embodiment, the sacrificial layer 114 includes a material different from the lower conductive layer 111, the first conductor and the second conductor. Thus, the sacrificial layer 114, the dummy layer 152 and the portion of the upper conductive layer 162 may be removed without damage to other components by using an etchant that may selectively remove the sacrificial layer 114. The upper conductive layer 162' remaining on the 3D memristor element 10 may function as a terminal transferring a voltage to the second conductor.

According to the above, a resistance-varying part and an upper conductive layer may be patterned in a desired area without an additional lithography process.

Hereinafter, a method for manufacturing a 3D memristor element according to embodiments will be explained with reference to examples. However, embodiments of the present invention are not limited to the examples.

Example 1

1. Manufacturing 3D Porous Template

A photoresist composition (trade name: SU-8 2, manufactured by Micro Chem) was spin-coated on a silicon wafer with a Cr layer (5 nm) and an Au layer (40 nm), which were deposited thereon, for 30 seconds by 3,000 rpm, and heated on a hot plate at 65° C. for 2 minutes and at 95° C. for 3 minutes to form a coated layer. Thereafter, a chromium mask was disposed on the coated layer, and the coated layer was exposed to a UV lamp of 365 nm for 1 minute and heated at 120° C. for 3 minutes to cross-link the photoresist composition unmasked by the chromium mask. Thereafter, a developer was provided to the coated layer to remove a portion, which was not light-exposed, thereby forming an adhesive film having an opening.

Thereafter, a photoresist composition (SU-8 10) was spin-coated for 30 seconds by 1,400 rpm, and heated on a hot plate at 65° C. and at 95° C. for 30 minutes, respectively, to form a photoresist film.

A phase mask formed of PDMS and having a convexoconcave surface with a periodically arranged rectangular lattice was disposed to contact the photoresist film. The phase mask included nano-pillars with a height of 420 nm, which were arranged in a rectangular shape with a period (pitch) of 600 nm. A laser having a wavelength of 365 nm was irradiated to the photoresist film through the phase mask, and a developer was provided to form a 3D porous template having pores (channels) periodically arranged along X axis and Y axis with a period of 600 nm and having a size of 1 $\mu$m along Z axis.

2. Filling 3D Porous Template Through Electroplating Process

The 3D porous template was filled with a metal through an electroplating process. Particularly, pores in the 3D porous template were filled with nickel at a room temperature through an electroplating process using Techni Nickel S (trade name, Technic Inc.). 1 cycle included applying a current of 2 mA/cm 2 for 5 seconds and blocking a current for 5 seconds, and 2160 of cycles were performed.

3. Removing 3D Porous Template

The 3D porous template was removed through a plasma etching process. The etching gas included $O_2$, $N_2$, and $CF_4$, and anisotropic etching was performed with 300 W at 40° C. for 150 minutes. As the 3D porous template was removed, a 3D nano-structure having an inverse shape of the 3D porous template was obtained.

4. Forming Resistance-Varying Part

ALD was performed to form a resistance-varying part having a nano-shell array shape surrounding a 3D porous first conductor defined by the 3D nano-structure formed of nickel and including aluminum oxide with a thickness of about 30 nm.

5. Forming Second Conductor Through Electroplating Process

Pores in a composite including the 3D porous first conductor and the resistance-varying part were filled with nickel through an electroplating process.

Figure 9:
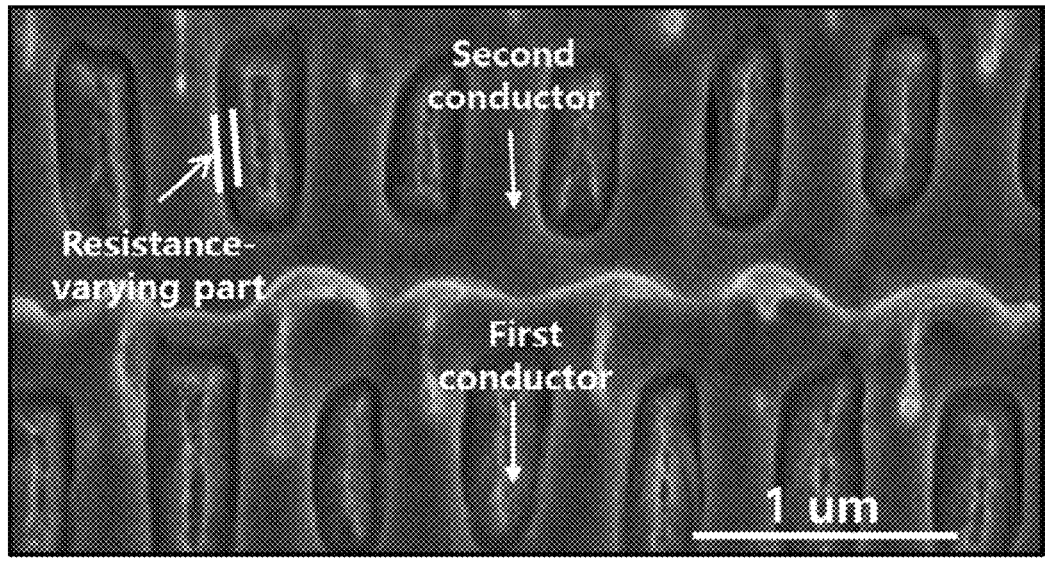
FIG. 9 is a scanning electron microscopy (SEM) photograph of a 3D nano-structure of Example 1.

FIG. 9 is a scanning electron microscopy (SEM) photograph of a 3D nano-structure of Example 1.

Referring to FIG. 9, it can be noted that a resistance-varying part having a nano-shell shape was formed between the first conductor and the second conductor.

A 3D memristor element according to embodiments may be used for various electronic devices such as a memory device, a computing device or the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A 3-dimensional (3D) memristor element comprising:
a 3D nano-composite including a resistance-varying part including a plurality of nano-shells, which are three-dimensionally arranged and connected to each other, a first conductor disposed in the nano-shells and having a 3D network structure thereby forming a 3D interface with the nano-shells, and a second conductor three-dimensionally surrounding the resistance-varying part and being separated from the first conductor by the resistance-varying part;
a first terminal electrically connected to the first conductor; and
a second terminal electrically connected to the second conductor.

2. The 3D memristor element of claim 1, wherein the resistance-varying part includes at least one of a metal, a metal oxide, a metal nitride and a polymer.

3. The 3D memristor element of claim 2, wherein the resistance-varying part includes at least one of $InO_2$, $SnO_2$, $SrTiO_3$, $SiO_x$, $CeO_2$, $Al_2O_3$, $TiO_2$, $ZnO$, $HfO_2$, $HfAlO_x$, $HfSiO_x$, $TaO_x$, $PCMO(Pr_{0.3}Ca_{0.7}MnO_3)$, $SiN_x$, $TiN_x$, $TaN_x$, amorphous silicon, Ag and pV3D3 (poly(1,3,5-trimethyl-1,3,5-trivinyl cyclotrisiloxane).

4. The 3D memristor element of claim 1, further comprising a dummy layer including a same material as the resistance-varying part and disposed on the first terminal,
wherein the second terminal is disposed on the dummy layer, and the first terminal is disposed under the 3D nano-composite.

5. The 3D memristor element of claim 4, wherein the second terminal includes a same material as the second conductor.

6. The 3D memristor element of claim 1, wherein a shell thickness of the resistance-varying part is 1 nm to 100 nm.

7. The 3D memristor element of claim 1, wherein the resistance-varying part includes:
a resistance-varying layer contacting the first conductor; and
an oxygen-storing layer contacting the second conductor and including a material different from the resistance-varying layer to have a composition including an oxygen vacancy.

8. The 3D memristor element of claim 7, wherein the resistance-varying layer includes a ferroelectric material, and the oxygen-storing layer includes at least one of $BiFeO_3$, $HfO_x$, $TiO_{2-x}$, $Sb_2Te_3$ and $TaO_{2-x}$.

9. The 3D memristor element of claim 1, wherein the first conductor includes:
a filling portion including a metal and spaced apart from the resistance-varying part; and
a contact layer including a metal oxide or a metal nitride and contacting the resistance-varying part.

* * * * *